United States Patent
Ono et al.

(10) Patent No.: US 10,722,983 B2
(45) Date of Patent: Jul. 28, 2020

(54) METHOD FOR MANUFACTURING SEMICONDUCTOR DEVICE

(71) Applicant: MITSUBISHI ELECTRIC CORPORATION, Chiyoda-ku, Tokyo (JP)

(72) Inventors: Katsumi Ono, Tokyo (JP); Kenji Hirano, Tokyo (JP); Masato Negishi, Tokyo (JP); Masato Suzuki, Tokyo (JP); Tatsuro Yoshino, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/096,001

(22) PCT Filed: Jun. 9, 2017

(86) PCT No.: PCT/JP2017/021484
§ 371 (c)(1),
(2) Date: Oct. 24, 2018

(87) PCT Pub. No.: WO2017/217335
PCT Pub. Date: Dec. 21, 2017

(65) Prior Publication Data
US 2019/0151999 A1    May 23, 2019

(30) Foreign Application Priority Data
Jun. 13, 2016   (JP) .................. 2016-116935

(51) Int. Cl.
*H01L 21/78*    (2006.01)
*B23K 26/53*    (2014.01)
(Continued)

(52) U.S. Cl.
CPC .............. *B23K 26/53* (2015.10); *H01L 21/78* (2013.01); *B23K 2101/40* (2018.08); *B23K 2103/56* (2018.08)

(58) Field of Classification Search
CPC ........... H01L 2824/00014; H01L 21/78; H01L 27/14634; H01L 27/1463; H01L 27/14643;
(Continued)

(56) References Cited

U.S. PATENT DOCUMENTS

2002/0115235 A1    8/2002  Sawada
2005/0226287 A1*  10/2005  Shah ........................ G01J 11/00
                                                                    372/25
(Continued)

FOREIGN PATENT DOCUMENTS

JP    2002324768 A    11/2002
JP    2003338652 A    11/2003
(Continued)

OTHER PUBLICATIONS

International Search Report (PCT/ISA/210) dated Aug. 22, 2017, by the Japan Patent Office as the International Searching Authority for International Application No. PCT/JP2017/02.
(Continued)

*Primary Examiner* — Caridad Everhart
(74) *Attorney, Agent, or Firm* — Buchanan Ingersoll & Rooney PC (57) ABSTRACT

A method for manufacturing a semiconductor device includes the steps of: preparing a semiconductor substrate including a first semiconductor layer and a second semiconductor layer; and irradiating the semiconductor substrate with laser light from the first semiconductor layer side to divide the semiconductor substrate into individual semiconductor chips. The first semiconductor layer includes a semi-
(Continued)

conductor material transparent to the laser light. The second semiconductor layer includes a semiconductor material opaque to the laser light. In the step of irradiating with the laser light, laser light having intensity that makes the semiconductor material of the first semiconductor layer opaque to the laser light is irradiated.

9 Claims, 6 Drawing Sheets

(51) Int. Cl.
    *B23K 103/00*     (2006.01)
    *B23K 101/40*     (2006.01)

(58) Field of Classification Search
    CPC ........... H01L 27/14687; H01L 21/0254; H01L 33/04; H01L 33/0075; H01L 2924/3512; B23K 2101/40; B23K 2104/56; B23K 26/53
    See application file for complete search history.

(56) References Cited

U.S. PATENT DOCUMENTS

2013/0280885 A1* 10/2013 Bayram ................ H01L 21/18
    438/458
2018/0126493 A1    5/2018  Hirano et al.

FOREIGN PATENT DOCUMENTS

| | | |
|---|---|---|
| JP | 2009018344 A | 1/2009 |
| JP | 2015153965 A | 8/2015 |
| WO | 2016208522 A1 | 12/2016 |

OTHER PUBLICATIONS

Written Opinion (PCT/ISA/237) dated Aug. 22, 2017, by the Japan Patent Office as the International Searching Authority for International Application No. PCT/JP2017/02.

Notification of Transmittal of Translation of the International Preliminary Report on Patentability (Forms PCT/IB/338 and PCT/IB/373) and the Written Opinion of the International Searching Authority (Form PCT/ISA/237) dated Dec. 27, 2018, in corresponding International Application No. PCT/JP2017/021484. (8 pages).

\* cited by examiner

METHOD FOR MANUFACTURING SEMICONDUCTOR DEVICE

TECHNICAL FIELD

The present invention relates to a method for manufacturing a semiconductor device including a step of dividing a semiconductor substrate into individual semiconductor chips by laser light.

BACKGROUND ART

Conventionally, there is a method in which a semiconductor substrate is divided into individual semiconductor chips by laser light. For example, Patent Document 1 describes a method for dividing a semiconductor substrate that is transparent to laser light used. In this method, power density of the laser light is increased to cause multiphoton absorption in the semiconductor substrate.

PRIOR ART DOCUMENTS

Patent Documents

Patent Document 1: JP 2015-153965 A (paragraphs [0009] to [0011])

SUMMARY OF THE INVENTION

Problems to be Solved by the Invention

Incidentally, in general, there is a spatial distribution in power density of laser light. According to the method described in Patent Document 1, laser light having large power density is multiphoton-absorbed by the semiconductor substrate, but laser light having small power density is transmitted without being absorbed by the semiconductor substrate. Therefore, the method in Patent Document 1 has room for improvement from a viewpoint of energy efficiency.

The present invention has been made to solve the above-mentioned problem, and it is an object thereof to provide a method for manufacturing a semiconductor device having higher energy efficiency than that of the prior art.

Means for Solving the Problems

In order to solve the above problem, a method for manufacturing a semiconductor device according to the present invention includes the steps of: preparing a semiconductor substrate including a first semiconductor layer and a second semiconductor layer; and irradiating the semiconductor substrate with laser light from the first semiconductor layer side to divide the semiconductor substrate into individual semiconductor chips. The first semiconductor layer includes a semiconductor material transparent to the laser light. The second semiconductor layer includes a semiconductor material opaque to the laser light. In the step of irradiating with the laser light, laser light having intensity that makes the semiconductor material of the first semiconductor layer opaque to the laser light is irradiated.

Effects of the Invention

According to the present invention, by providing a second semiconductor layer which is opaque to laser light, energy efficiency is higher than that of the related art, and a semiconductor substrate can be rapidly and reliably divided into individual pieces as compared with the related art.

EMBODIMENTS OF THE INVENTION

Hereinafter, a method for manufacturing a semiconductor device according to embodiments of the present invention will be specifically described with reference to the drawings. In the following description, terms (upper, lower, etc.) indicating specific directions are used as necessary. However, these terms are used to facilitate understanding of the present invention, and it should not be understood that the scope of the present invention is limited by these terms. In the following description, a direction indicated by a symbol "X" is referred to as a width direction, a direction indicated by a symbol "Y" is referred to as a length direction, and a direction indicated by a symbol "Z" is referred to as a height direction. The X direction, the Y direction, and the Z direction are orthogonal to each other.

Generally, in a semiconductor material, when light having photon energy higher than band gap energy arrives, electrons are transferred from a valence band to a conduction band by absorbing the light. As a result, the semiconductor material has a property of absorbing light having a wavelength equal to or less than a certain size and making the light impermeable. In the present specification, this wavelength is referred to as an absorption edge wavelength.

In the following description, a material is "transparent to laser light" means that incident laser light is transmitted without being absorbed by the material. For example, in a case of a semiconductor material, when an absorption edge wavelength thereof is shorter than a peak wavelength of laser light irradiated on the semiconductor material, the laser light is basically transmitted without being absorbed by the material (unless the laser light is reflected on a surface). Also, a material is "opaque to laser light" means that at least a part of incident laser light is absorbed by the material. For example, in a case of a semiconductor material, when an absorption edge wavelength thereof is longer than a peak wavelength of laser light, at least a part of the laser light is absorbed by the semiconductor material.

First Embodiment

Hereinafter, after describing structures of a semiconductor substrate 1 and a laser light irradiation unit 10, a method for manufacturing a semiconductor device will be described.
(Semiconductor Substrate 1)

Figure 1:
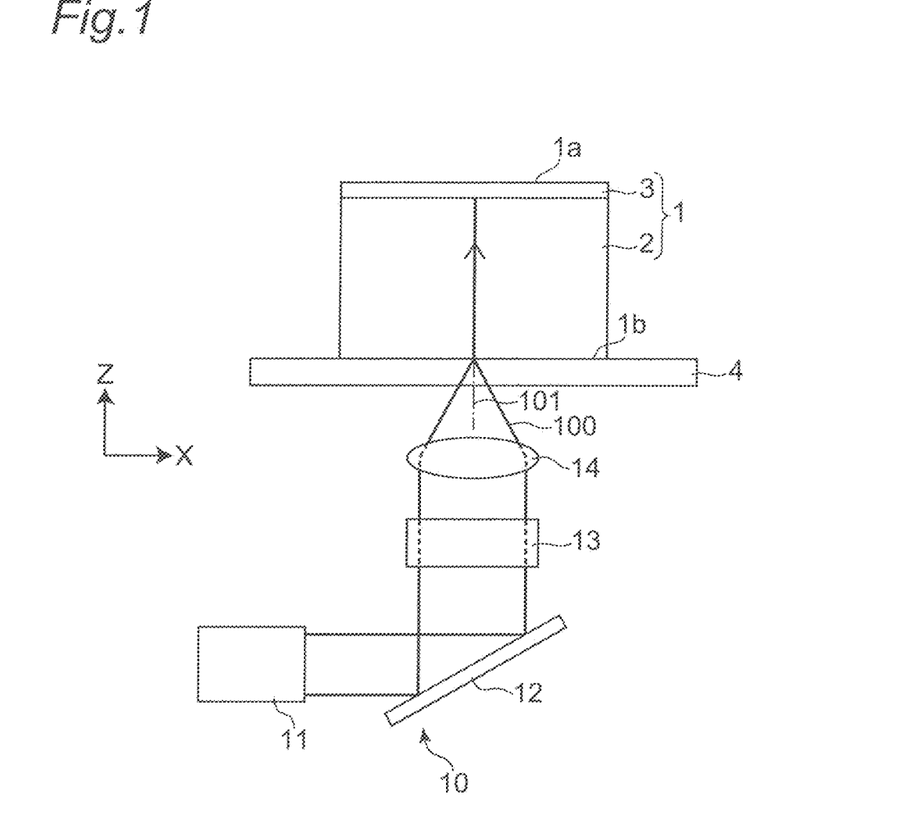
FIG. 1 is a schematic view showing a semiconductor substrate division device according to a first embodiment of the present invention.

As shown in FIG. 1, the semiconductor substrate 1 has an upper surface 1a (or a first surface) and a lower surface 1b (or a second surface). On the upper surface 1a of the semiconductor substrate 1, a plurality of semiconductor elements is formed (not shown). The semiconductor substrate 1 includes a second semiconductor layer 3 provided on the upper surface 1a side and a first semiconductor layer 2 provided on the lower surface 1b side. The first semiconductor layer 2 includes a semiconductor material transparent to laser light 100. The semiconductor material may have an absorption edge wavelength of about 870 nm or more and about 1100 nm or less. Examples of the semiconductor material include Si (silicon), GaAs (gallium arsenide), InP (indium phosphide), and the like.

The second semiconductor layer 3 contains a semiconductor material opaque to the laser light 100. An absorption edge wavelength of the semiconductor material may be an absorption edge wavelength of about 1100 nm or more and about 1600 nm or less. Examples of the material constituting the second semiconductor layer 3 include InGaAsP (indium gallium arsenide phosphide) and a laminate composed of InGaAs (indium gallium arsenide) and InGaAsP. The second semiconductor layer 3 may be formed on the first semiconductor layer 2, for example, by epitaxial growth.

Figure 2:
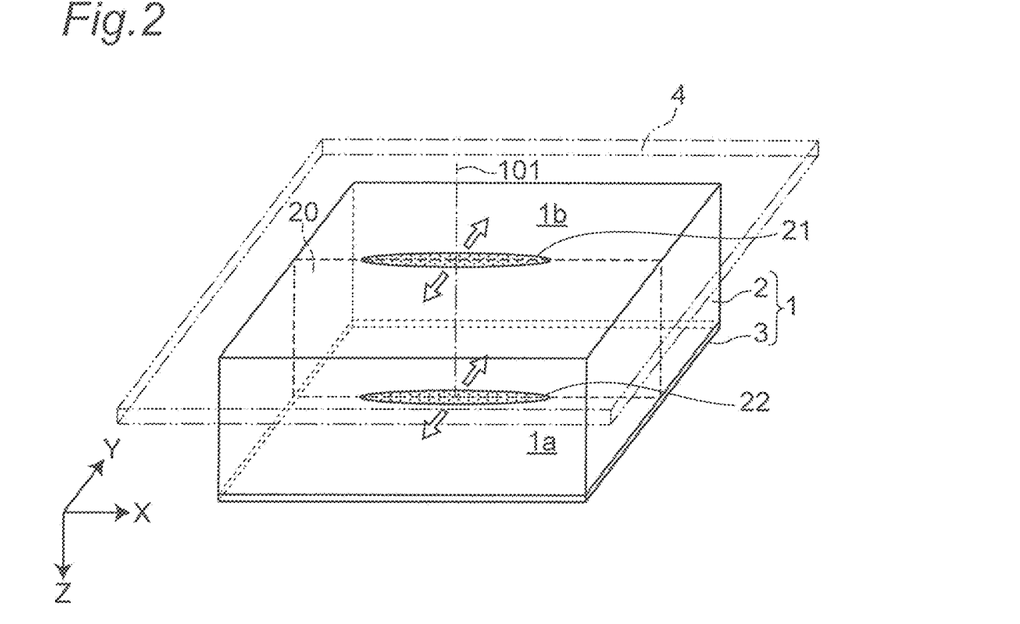
FIG. 2 is a view showing a laser irradiation step included in a method for manufacturing a semiconductor device according to the first embodiment of the present invention.

A division surface of the semiconductor substrate 1 is shown in FIG. 2 with a reference numeral 20. In FIG. 2, the division surface 20 is provided at one location extending in a width direction X. Here, in general, a plurality of semiconductor elements is two-dimensionally arranged on the semiconductor substrate 1. Therefore, for example, the division surface 20 may be provided at plural locations in two directions orthogonal to each other (for example, the width direction X and a length direction Y).

On the lower surface 1b of the semiconductor substrate 1, a fixing member 4 is provided. The fixing member 4 has adhesiveness and is fixed by being attached to the lower surface 1b of the semiconductor substrate 1. Therefore, in the first embodiment, the lower surface 1b of the semiconductor substrate 1 coincides with a boundary surface between the semiconductor substrate 1 (or the first semiconductor layer 2) and the fixing member 4. The fixing member 4 has a function of holding the semiconductor substrate 1 when the semiconductor substrate 1 is divided into individual pieces by the division surface 20. The fixing member 4 is fixed to a frame member (not shown), and this frame member is fixed to a division device (not shown). The division device includes a laser light irradiation unit 10. In this manner, a relative position of the semiconductor substrate 1 with respect to the laser light irradiation unit 10 is maintained.

The fixing member 4 may be a sheet material transparent to the laser light 100. An exemplary material for the fixing member 4 is an insulator such as PVC (vinyl chloride resin) or PO (polyolefin resin).
(Laser Light Irradiation Unit 10)

The laser light irradiation unit 10 includes a laser light source 11, a reflection mirror 12, a cylindrical lens 13, and an objective lens 14. In FIG. 1, illustration of a beam expander for expanding and collimating a beam diameter of laser light emitted from the laser light source 11 is omitted.

An exemplary wavelength of the laser light 100 emitted from the laser light source 11 is 1064 nm, which is a wavelength of a fundamental wave of YAG (yttrium aluminum garnet) laser. Exemplary crystals for laser oscillation used for the laser light source 11 include an Nd:YAG (neodymium:YAG) crystal, an Nd:YVO4 (neodymium:yttrium vanadium tetraoxide) crystal, and the like. The exemplified crystals are characterized by a fact that a thermal lens effect tends to occur more easily than, for example, an Nd:YLF (neodymium:yttrium lithium fluoride) crystal which is not easily influenced by temperature.

The wavelength of the laser light 100 is preferably slightly longer than the absorption edge wavelength of the semiconductor substrate 1, and is preferably within a range of an atmospheric window (for example, 0.2 μm to 1.2 μm) which is substantially not absorbed into the atmosphere at room temperature.

Here, the semiconductor material of the first semiconductor layer 2 is transparent to the laser light 100, but when laser power density P exceeds a certain threshold value Pth, multiphoton absorption occurs. The laser power density P of the laser light 100 is set to a value larger than the threshold value Pth. An amount of energy absorption due to the multiphoton absorption is proportional to an nth power of energy density of the irradiated laser light 100 (n is the number of photons). For example, in a case of two-photon absorption, the amount of energy absorption is proportional to a square of the energy density of the laser light 100.

In order to increase the laser power density P of the laser light 100, in the first embodiment, the laser light source 11 is provided with a Q switch element (not shown) having a function of achieving high-power pulse oscillation by rapidly changing a Q value of an optical resonator. Accordingly, Q switch laser light with a high peak value is emitted. A pulse width of the Q switch laser light is preferably 1 μs or less so that energy per pulse is sufficiently large.

A laser parameter of the laser light 100 (a pulse width, a repetition frequency, pulse energy, a peak output, etc., if the laser light 100 is a pulse laser) is set to a value at which the first semiconductor layer 2 can be vaporized (or thermally decomposed).

The cylindrical lens 13 has a function of converting an incident circular beam into a flattened elliptical beam and emitting the beam. Instead of the cylindrical lens 13, another optical system such as an anamorphic prism may be used to convert a circular beam into an elliptical beam. The objective lens 14 may be a convex lens, a combination lens of a convex lens and a concave lens, or the like. An exemplary NA (numerical aperture) of the objective lens 14 is about 0.4.

(Method for Manufacturing Semiconductor Device)

A method for manufacturing a semiconductor device according to the first embodiment includes a step of preparing the semiconductor substrate 1, and a step of irradiating the semiconductor substrate 1 with the laser light 100 from the first semiconductor layer 2 side (the lower surface 1*b* side) by using the laser light irradiation unit 10. An optical axis of the laser light 100 is indicated by a reference numeral 101.

In the step of preparing the semiconductor substrate 1, the second semiconductor layer 3 is epitaxially grown on the first semiconductor layer 2 by, for example, an MOCVD (a metal-organic chemical vapor deposition method) or an LPE (a liquid phase epitaxial growth method). The first semiconductor layer 2 is preferably a single crystal. Next, desired semiconductor elements are formed in the second semiconductor layer 3 by a known method such as a lithography technique. Next, the semiconductor substrate 1 is attached to the fixing member 4.

In the step of irradiating with the laser light 100, the cylindrical lens 13 and the objective lens 14 are disposed so that a first convergence point 21 of the laser light 100 is formed on the lower surface 1*b* of the semiconductor substrate 1 (in the first embodiment, coinciding with the boundary surface between the semiconductor substrate 1 and the fixing member 4, and a lower surface of the first semiconductor layer 2) (see FIG. 2). The first convergence point 21 may be located above the lower surface 1*b* of the semiconductor substrate 1, that is, within the first semiconductor layer 2.

Since the cylindrical lens 13 is used, a beam shape at the first convergence point 21 is an elliptical shape. At this time, the cylindrical lens 13 and the objective lens 14 are disposed so that a major axis of the ellipse is along a cutting line defining the division surface 20.

In this specification, the "convergence point" refers to a region where a light beam of the laser light emitted from the objective lens 14 is gathered on the optical axis 101. The convergence point is not limited to a paraxial focal point determined by the objective lens 14, and may refer to a point shifted by a slight distance from the focal point along the optical axis 101. In particular, since the elliptical beam is used in the first embodiment, it should be noted that a point at which a spot diameter of the laser light 100 is minimized is different from the paraxial focal point.

In the first embodiment, since the Q switch laser light is used as the laser light 100, power density (light intensity [W] per unit area [cm$^2$]) at the first convergence point 21 can be several MW/cm$^2$ or more. As a result, multiphoton absorption occurs in the second semiconductor layer 3 of the semiconductor substrate 1, and a part of the laser light 100 passing through the semiconductor substrate 1 if the multiphoton absorption does not occur is absorbed. Thereby, the laser light 100 is absorbed at the first convergence point 21, and the semiconductor substrate 1 is heated.

Even in a state where the laser light 100 is converged at the first convergence point 21, because of existence of a focal depth, not only the first convergence point 21 located on the lower surface 1*b* of the semiconductor substrate 1 but also an inside of the semiconductor substrate 1 is heated.

When the semiconductor substrate 1 is heated and temperature thereof rises, a band gap of the semiconductor material of the semiconductor substrate 1 decreases. As a result, a shift to a long wavelength side of the absorption edge wavelength (hereinafter referred to as "red shift") occurs in a portion heated in the semiconductor substrate 1 and a surrounding portion thereof, and an absorptance of the laser light 100 increases.

The laser light 100 travels toward the upper surface 1*a* side of the semiconductor substrate 1. The following processes (1) to (4) are continuously carried out until the irradiation of the laser light 100 is completed along an optical path of the laser light 100 directed from the fixing member 4 on the lower surface 1*b* side to the second semiconductor layer 3 on the upper surface 1*a* side.

(1) A certain portion of the semiconductor substrate 1 is heated by the laser light 100.

(2) The temperature of the portion rises and the red shift of the absorption edge wavelength of the semiconductor material occurs.

(3) The absorptance of the laser light becomes high in this portion, and this portion is further heated.

(4) Thermal conduction from the portion to the surroundings occurs, and the surrounding portion is heated.

As a result of the above processes (1) to (4) that are continuously progressed, the heated region expands in a thickness direction (the height direction Z) of the semiconductor substrate 1 along the optical axis 101 of the laser light 100. For example, when the pulse width of the laser light 100 is several 100 ns, the heated region reaches ten and several μm at a distance in the height direction Z.

In the heated region along the optical axis 101, a force that pushes and expands a periphery is generated due to thermal expansion of the first semiconductor layer 2. In the first embodiment, since the first convergence point of the laser light 100 is elliptical, a force for generating a crack along the major axis of the ellipse is generated at the first convergence point 21. In this manner, a crack is formed on the lower surface 1*b* of the semiconductor substrate 1 (see FIG. 3).

Figure 3:
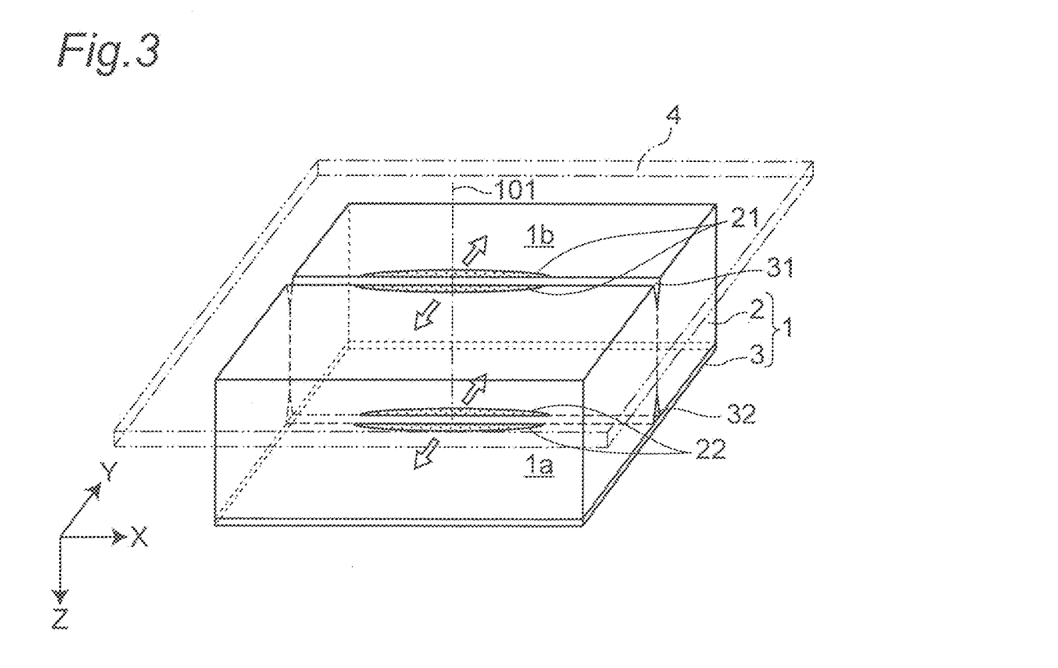
FIG. 3 is a view showing the laser irradiation step included in the method for manufacturing the semiconductor device according to the first embodiment of the present invention.

In a case where an amount of energy absorbed by the semiconductor substrate 1 is sufficiently large, the semiconductor material of the first semiconductor layer 2 is vaporized (or thermally decomposed) at a portion that has absorbed energy several nanoseconds after the irradiation with the laser light 100 is started, and gas of the semiconductor material is ejected to the boundary surface between the fixing member 4 and the semiconductor substrate 1. Due to the thermal expansion of the first semiconductor layer 2 and the gas ejection described above, crack opening forces 41*a* and 41*b* for pushing and expanding the crack generated on the lower surface 1*b* of the semiconductor substrate 1 are added in the length direction Y, and the crack further develops.

Further, a gap is formed between the fixing member 4 and the semiconductor substrate 1 by the ejection of the gas. A push-up force 50 is generated in the semiconductor substrate 1 by the formation of the gap. The semiconductor substrate 1 is pushed up, and tensile stress is generated on the upper surface 1*a* of the semiconductor substrate 1.

Figure 6:
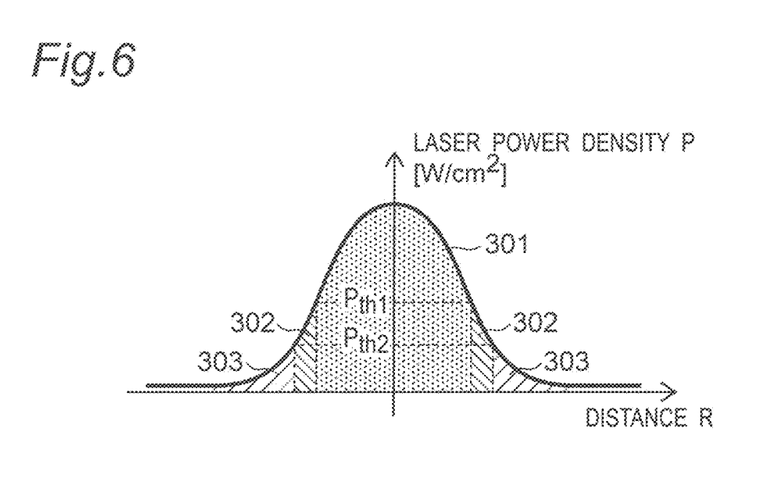
FIG. 6 is a graph showing a spatial distribution of power density of laser light.
Figure 7:
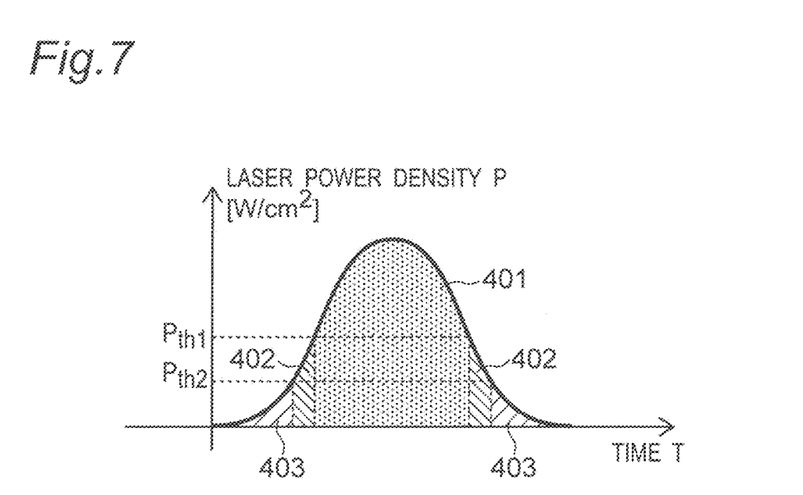
FIG. 7 is a graph showing a time distribution of the power density of the laser light.

Here, as shown in FIG. 6, the power density P of the laser light 100 has a spatial distribution centered on an optical axis of the cylindrical lens 13 and the objective lens 14 (which coincides with the optical axis 101 of the laser light 100). The power density P of the laser light 100 decreases as the distance from the optical axis 101 increases. Further, as shown in FIG. 7, the power density P of the laser light 100 may have a time distribution from a rise to a fall of the laser light 100. Typically, the power density P of the laser light 100 decreases at the rise and fall of the laser light 100. Although the power density P shown in FIGS. 6 and 7 has a Gaussian distribution (normal distribution) or a shape close thereto, the present invention is not limited to this and can be applied to a distribution having plural peaks, for example.

The laser light in a region in which the power density P is equal to or higher than a first threshold value Pth1 (a reference numeral 301 in FIG. 6, a reference numeral 401 in FIG. 7) is multiphoton-absorbed by the first semiconductor layer 2. The laser light in a region in which the power density P is smaller than the first threshold value Pth1 and equal to or higher than the second threshold value Pth2 (a reference numeral 302 in FIG. 6, a reference numeral 402 in FIG. 7) is absorbed by the first semiconductor layer 2 due to the red shift of the absorption edge wavelength of the semiconductor material of the first semiconductor layer 2. The laser light in a region in which the power density P is smaller than the second threshold value Pth2 (a reference numeral 303 in FIG. 6, a reference numeral 403 in FIG. 7) is not absorbed by the first semiconductor layer 2 and passes through the first semiconductor layer 2.

When the lower surface 1b of the semiconductor substrate 1 is heated by the laser light 100, the surrounding portion of the lower surface 1b is also heated by thermal conduction. As described above, since the peak wavelength of the laser light 100 is close to the absorption edge wavelength of the semiconductor material of the first semiconductor layer 2, the heating of this surrounding portion raises a refractive index of the semiconductor material of the surrounding portion with respect to the laser light 100. As a result, the laser light 100 passing through the above surrounding portion is subject to a converging action by a thermal lens effect. As a result, on a boundary surface between the first semiconductor layer 2 and the second semiconductor layer 3, inside of the second semiconductor layer 3, or on an upper surface of the second semiconductor layer 3 (the upper surface 1a of the semiconductor substrate 1), a second convergence point 22 in which the laser light 100 is converged to some extent can be formed. The second convergence point 22 is also elliptical like the first convergence point 21.

Since the absorption edge wavelength of the second semiconductor layer 3 is 1100 nm or more and 1600 nm or less, almost all of the laser light 100 transmitted through the first semiconductor layer 2 is absorbed at the second convergence point 22.

Figure 4:
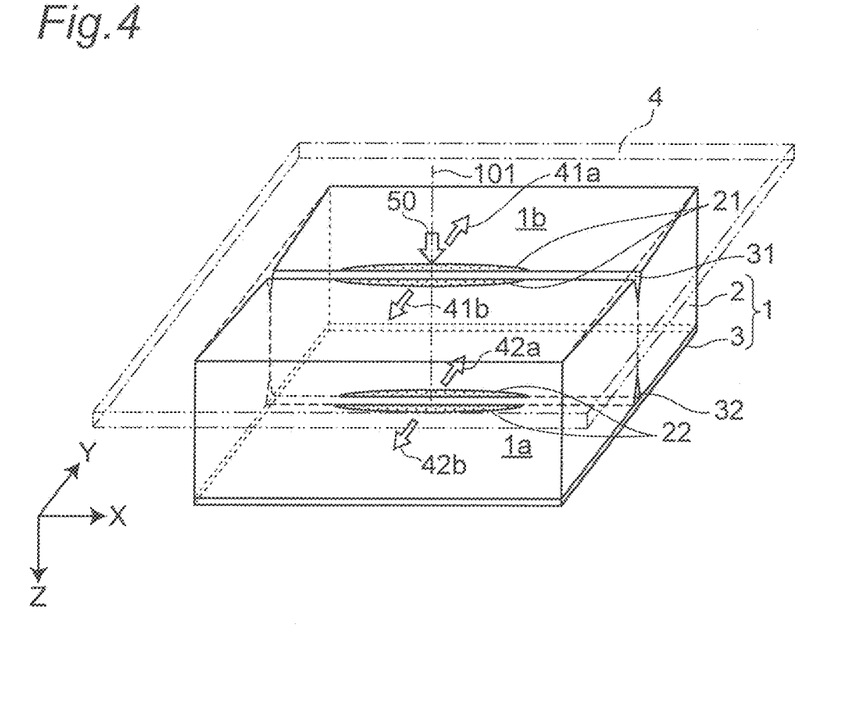
FIG. 4 is a view showing the laser irradiation step included in the method for manufacturing the semiconductor device according to the first embodiment of the present invention.
Figure 5:
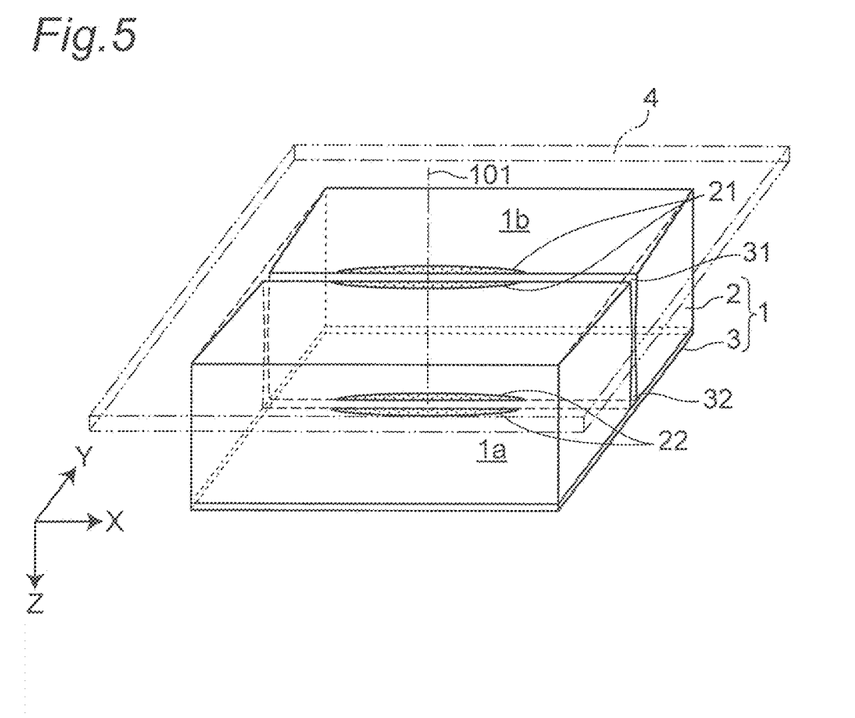
FIG. 5 is a view showing the laser irradiation step included in the method for manufacturing the semiconductor device according to the first embodiment of the present invention.

In the second semiconductor layer 3, similarly to the lower surface 1b of the semiconductor substrate 1, a force that pushes and expands a periphery is generated due to thermal expansion of the second semiconductor layer 3. Further, as described above, the formation of the gap between the fixing member 4 and the semiconductor substrate generates the push-up force 50 on the semiconductor substrate 1, and the tensile stress acts on the upper surface 1a of the semiconductor substrate 1. The crack opening forces 42a and 42b for generating and growing a crack along a major axis of the ellipse of the second convergence point 22 are thus applied to the upper surface 1a of the semiconductor substrate 1 in the length direction Y. Then, a crack is formed in the second semiconductor layer 3 or a surrounding portion thereof, and the crack progresses (see FIG. 4). By irradiating the laser light 100 for a certain time or more, the semiconductor substrate 1 is separated (see FIG. 5).

As described above, in the first embodiment, the semiconductor substrate 1 is cut by utilizing the multiphoton absorption of the semiconductor material of the first semiconductor layer 2 including the semiconductor material transparent to the laser light 100. The laser light having low power density which has passed through the first semiconductor layer 2 without being multiphoton-absorbed by the first semiconductor layer 2 (without being absorbed due to the red shift) is not dissipated to the outside of the semiconductor substrate 1 and is absorbed by the second semiconductor layer 3 including the semiconductor material opaque to the laser light 100. Thereby, a method for manufacturing a semiconductor device with high energy efficiency can be obtained.

Further, since the laser light is absorbed by both the first semiconductor layer 2 and the second semiconductor layer 3, as described above, cracks 31 and 32 are formed on the upper surface 1a and the lower surface 1b of the semiconductor substrate 1, respectively. At this time, the crack opening forces 41a, 41b acting on the lower surface 1b of the semiconductor substrate 1 and crack opening forces 42a, 42b acting on the second semiconductor layer 3 side both occur within the same pulse width of the laser light 100 and act at almost the same time. Thus, the semiconductor substrate 1 is divided. By providing the second semiconductor layer 3 in this manner, the substrate is cut from both the upper surface 1a side and the lower surface 1b side of the semiconductor substrate 1, so that the semiconductor substrate 1 can be separated quickly and reliably, an irradiation time of the laser light 100 is shortened, and the energy efficiency is further improved.

In particular, in the first embodiment, since the elliptical laser light 100 is irradiated and the major axis of the ellipse is along the cutting line that defines the division surface 20 at the first convergence point 21, the crack opening forces can be guided so as to act in the width direction Y along the line. This further improves energy efficiency.

Also, in the first embodiment, the fixing member 4 for holding the semiconductor substrate 1 is suitably used. Specifically, when the semiconductor material of the semiconductor substrate 1 is vaporized (or thermally decomposed), since the fixing member 4 is provided, gas is accumulated in the gap between the semiconductor substrate 1 and the fixing member 4, and the push-up force 50 is generated on the semiconductor substrate 1. As a result, the semiconductor substrate 1 can be more quickly and reliably separated.

Second Embodiment

In description of a second embodiment, the same reference numerals are given to the same configurations as those in the first embodiment, and description of the configurations is omitted. In the second embodiment, semiconductor elements are formed in a second semiconductor layer 3, and a transparent layer transparent to laser light 100 is further provided on the second semiconductor layer 3. The transparent layer is made of a $SiO_x$ (silicon oxide) film, a SiN (silicon nitride) film, or the like, and may be a passivation film provided to electrically and mechanically protect an upper surface 1a of a semiconductor substrate 1.

According to the second embodiment, since the second semiconductor layer 3 can be formed together in the step of forming the semiconductor elements without performing another step, manufacturing efficiency of a semiconductor device is improved.

Third Embodiment

In description of a third embodiment, the same reference numerals are given to the same configurations as those in the first and second embodiments, and description of the configurations is omitted. In the first and second embodiments, the objective lens 14 and the like are disposed so that the first convergence point 21 of the laser light 100 is located on the lower surface 1b of the semiconductor substrate 1 (or inside of the first semiconductor layer 2). In the third embodiment, an objective lens 14 and the like are disposed so that a convergence point 21 of laser light 100 is located inside a fixing member 4.

Further, in the third embodiment, a material defect is introduced into the fixing member 4 which is an insulator. The material defect refers to a singularity of a molecular arrangement, a foreign matter, a scratch, or the like occurring in a material constituting the fixing member 4. For example, if the material constituting the fixing member 4 is a resin, the foreign matter may be a filler mixed in the resin. The material defect is introduced so that light passing through the fixing member 4, if the material defect is not present, is absorbed by the material defect. Note that the material defect may be a lattice defect (a point defect, a line defect, or a plane defect) originally present in the material constituting the fixing member 4. In the third embodiment, the laser light 100 with a sufficiently high power density is irradiated so that energy absorption due to the material defect can be utilized.

According to the third embodiment, the convergence point 21 moves to the inside of the fixing member 4, whereby the same effect as those of the first and second embodiments can be obtained. In particular, in the third embodiment, since the first convergence point 21 is located inside the fixing member 4, a product formed by cooling and solidifying after a first semiconductor layer 2 is vaporized (or thermally decomposed) does not adhere to a semiconductor substrate 1. Thereby, a step of cleaning the semiconductor substrate 1 can be omitted, and an effect of reducing manufacturing cost can be obtained.

Fourth Embodiment

In description of a fourth embodiment, the same reference numerals are given to the same configurations as those in the first to third embodiments, and description of the configurations is omitted. In the fourth embodiment, an objective lens 14 and the like are disposed so that a convergence point of laser light 100 is located inside a semiconductor substrate 1, for example, in the vicinity of a center in a thickness direction of the semiconductor substrate 1.

According to the fourth embodiment, it is possible to obtain the same effect as the effect described in the third embodiment.

Fifth Embodiment

In description of a fifth embodiment, the same reference numerals are given to the same configurations as those in the first to fourth embodiments, and description of the configurations is omitted. In the fifth embodiment, a highly rigid plate member transparent to laser light 100 is attached to a lower surface of a fixing member 4. An example of the highly rigid plate member is a fused silica glass plate.

According to the fifth embodiment, expansion of a semiconductor material of a first semiconductor layer 2 to an opposite side to a semiconductor substrate 1 by receiving a force from gas generated by vaporization (or thermal decomposition) can be suppressed, and a push-up force 50 can reliably act on the semiconductor substrate 1 side. As a result, separation of the semiconductor substrate 1 can be performed more quickly and reliably.

Sixth Embodiment

In description of a sixth embodiment, the same reference numerals are given to the same configurations as those in the first to fifth embodiments, and description of the configurations is omitted. In the sixth embodiment, a crack is formed in advance by scribing, for example, by a diamond point along a cutting line that defines a division surface 20 of a semiconductor substrate 1.

According to the sixth embodiment, since the crack formed in advance is a starting point and the crack easily propagates toward a processed portion, separation of the semiconductor substrate 1 can be performed more quickly and reliably.

Seventh Embodiment

In description of a seventh embodiment, the same reference numerals are given to the same configurations as those in the first to sixth embodiments, and description of the configurations is omitted. In the seventh embodiment, as in the sixth embodiment, a crack is formed in advance in a cutting line that defines a division surface 20 of a semiconductor substrate 1. Further, in the seventh embodiment, unlike the first to sixth embodiments, circular laser light is irradiated without providing a cylindrical lens (or an anamorphic lens) that converts laser light into an elliptical shape.

Eighth Embodiment

In description of an eighth embodiment, the same reference numerals are given to the same configurations as those in the first to seventh embodiments, and description of the configurations is omitted.

In the eighth embodiment, a reflective film (a reflective layer) which is transparent to laser light 100 and has high reflectance is provided on an upper surface side of a second semiconductor layer 3. The reflective film is preferably melted by receiving heat from a semiconductor substrate 1. Examples of a material constituting the reflective film include metals such as Au (gold) and Al (aluminum), or a semiconductor with high reflectance such as germanium.

According to the eighth embodiment, the laser light that has transmitted without being absorbed by the second semiconductor layer 3 is reflected toward the second semiconductor layer 3 side and absorbed by the second semiconductor layer 3, so that energy efficiency can be further improved.

Ninth Embodiment

In description of a ninth embodiment, the same reference numerals are given to the same configurations as those in the first to eighth embodiments, and description of the configurations is omitted. As described with reference to FIG. 7, the power density of the laser light 100 has the time distribution from the rise to the fall. In the first to eighth embodiments, the time distribution of the power density P of the laser light 100 with respect to an elapsed time T of the laser light 100 is symmetrical with respect to a certain elapsed time. In the ninth embodiment, the distribution is shifted to an irradiation start side or an irradiation end side.

In the ninth embodiment, when the time distribution of power density P is shifted to the irradiation start side, multiphoton absorption occurs in a first semiconductor layer 2 at an early stage after the start of irradiation with laser light 100, and a thermal lens effect is generated at the early stage. Accordingly, it is possible to further reduce a width (a distance in a width direction X) of a second convergence point 22, and it is possible to further improve energy efficiency.

In the ninth embodiment, when the time distribution of the power density P is shifted to the irradiation end side, multiphoton absorption at a first convergence point 21 is started after processing a second semiconductor layer 3. Accordingly, it is possible to efficiently utilize a portion, of crack opening forces 42a, 42b applied to a crack 32 formed in the second semiconductor layer 3, caused by a push-up force 50, and it is possible to perform separation of a semiconductor substrate 1 more quickly and reliably.

As a modification of the ninth embodiment, a plurality of peaks may be provided in the time distribution of the power density P. For example, at a first peak, heating is performed to cause multiphoton absorption but not to cause vaporization (or thermal decomposition) of a first semiconductor layer 2, and a thermal lens effect occurs. Accordingly, a second convergence point 22 formed in a second semiconductor layer 3 is further converged. As a result, crack opening forces 42a, 42b on the second semiconductor layer 3 side are generated, and an initial crack can be generated on the second semiconductor layer 3 side. Next, at a second peak, the first semiconductor layer 2 is vaporized (or thermally decomposed) and a push-up force 50 is generated. In this manner, separation of a semiconductor substrate 1 can be performed more rapidly and reliably.

EXAMPLE

Next, a method for manufacturing a semiconductor device according to the embodiments of the present invention will be specifically described with reference to an example and a comparative example. The scope of the present invention is not limited to the contents of the following example.

In the example, InP was used as the material of the first semiconductor layer 2 constituting the semiconductor substrate 1. In addition, a laminate formed by stacking a plurality of InGaAs and InGaAsP was used as the second semiconductor layer 3. As the fixing member 4, a PVC sheet was used. Further, in the example, a plate member (a fused glass silica plate) was attached to the lower surface of the fixing member 4. For the laser light 100 emitted from the laser light source 11, a YAG excitation fiber laser was used. Irradiation conditions of the laser light 100 were as follows: a pulse energy is 0.1 mJ; a pulse width is 160 ns; and a beam ellipticity ratio (a ratio of the major axis to a minor axis) is 25. A beam convergence point was set on the lower surface 1b of the semiconductor substrate 1 which is the boundary surface between the semiconductor substrate 1 and the fixing member 4. As a comparative example, a semiconductor substrate having no second semiconductor layer 3 (including a first semiconductor layer 2, a fixing member 4, and the plate member) was prepared. Other conditions in the comparative example are the same as those in the example.

Figure 8A:
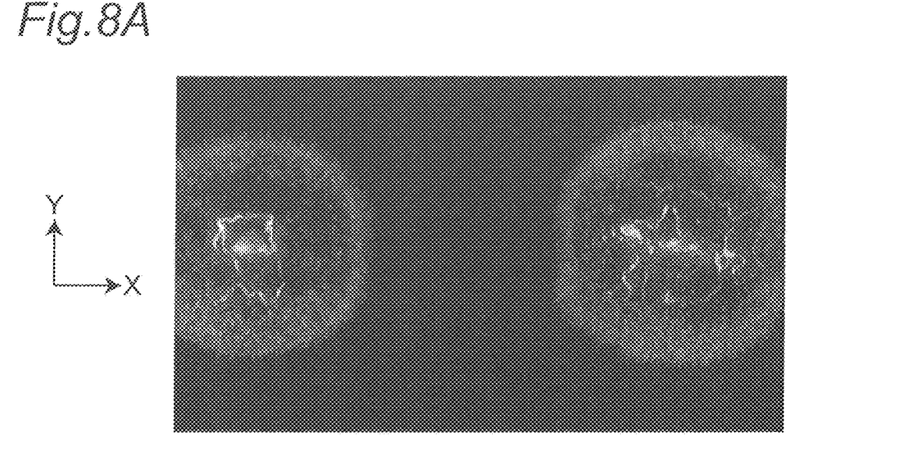
FIG. 8A is an optical microscope photograph (taken from an upper surface side) showing a result of irradiating a semiconductor substrate according to an example with laser light.
Figure 8B:
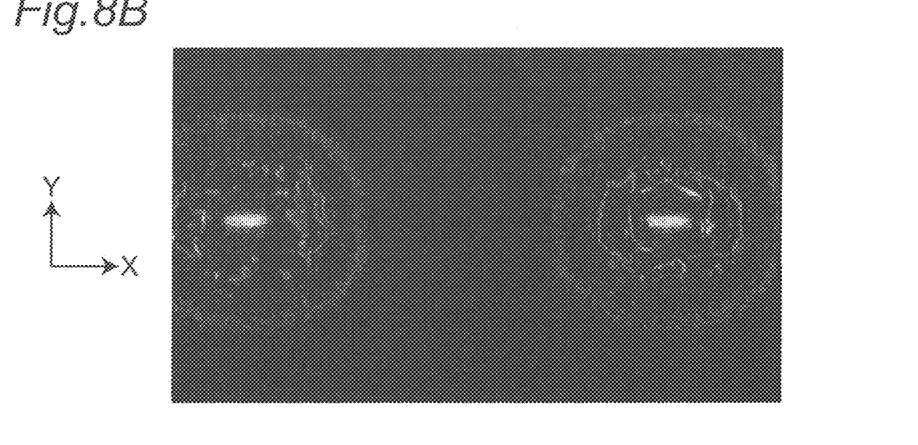
FIG. 8B is an optical microscope photograph (taken from an upper surface side) showing a result of irradiating a semiconductor substrate according to a comparative example with laser light.
Figure 9:
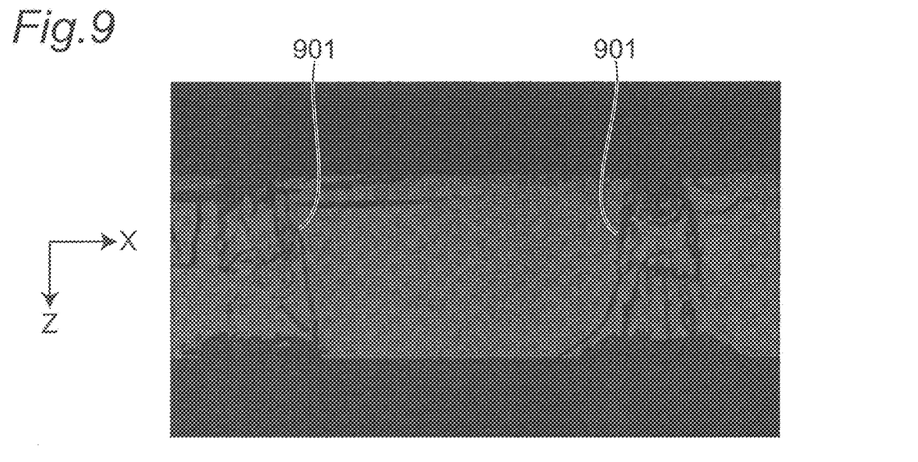
FIG. 9 is an optical microscopic photograph (a photograph of a cross section along a laser irradiation direction) showing a result of irradiating the semiconductor substrate according to the example with the laser light.
Figure 10A:
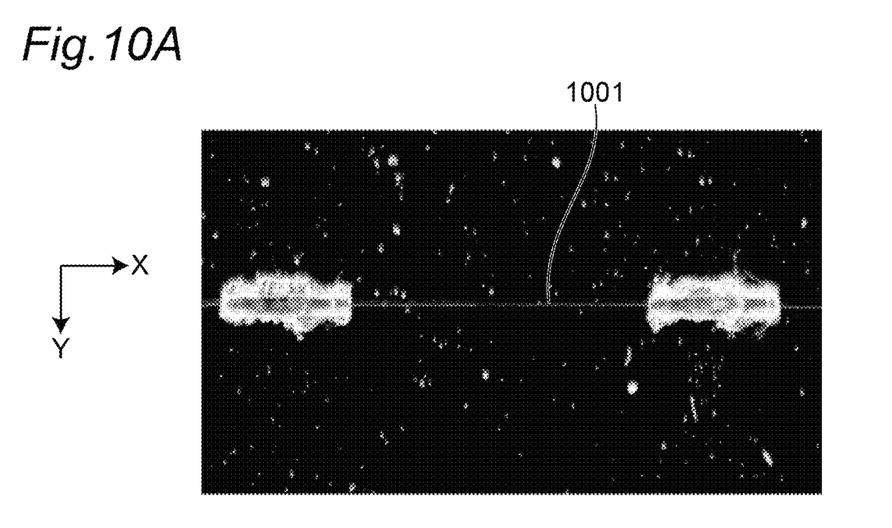
FIG. 10A is an optical microscopic photograph (taken from a lower surface side) showing a result of irradiating the semiconductor substrate according to the example with the laser light.
Figure 10B:
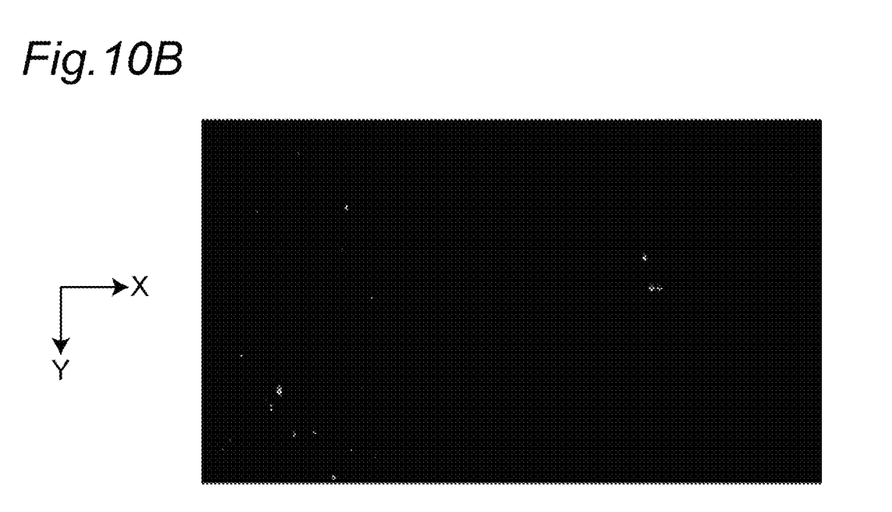
FIG. 10B is an optical microscopic photograph (taken from a lower surface side) showing a result of irradiating the semiconductor substrate according to the comparative example with the laser light.

Results of irradiating the semiconductor substrate 1 according to the example and the semiconductor substrate according to the comparative example with the laser light 100 under the irradiation conditions described above will be described. FIGS. 8A, 9, and 10A are optical microscopic photographs showing the results of the example. FIG. 8A is a photograph taken from the upper surface 1a side (that is, the side irradiated with the laser light), FIG. 9 is a photograph of a cross section taken along a laser irradiation direction, and FIG. 10A is a photograph taken from the lower surface 1b side (that is, the side opposite to the side irradiated with the laser light). FIGS. 8B and 10B are optical microscopic photographs showing the results of the comparative example. FIG. 8B is a photograph taken from an upper surface side, and FIG. 10B is a photograph taken from a lower surface side. In the drawings describing the example, the reference numerals indicating the directions used in FIGS. 1 to 7 are given.

Referring to FIG. 9, it can be seen that in the semiconductor substrate 1 according to the example, a locus 901 of the laser light extended from the upper surface to the lower surface. Further, referring to FIG. 10A, it can be seen that a crack 1001 was generated on the lower surface of the semiconductor substrate 1 (including the second semiconductor layer 3) according to the example. On the other hand, referring to FIG. 10B, a crack was not able to be confirmed on the lower surface of the semiconductor substrate (not including the second semiconductor layer 3) according to the comparative example. Therefore, it is considered that a reason why the crack 1001 was generated on the lower surface of the semiconductor substrate according to the example is that absorption of the laser light was suitably performed not only in the first semiconductor layer 2 but also in the second semiconductor layer 3.

Although not shown in the drawings, even when the plate member (the fused glass silica plate) was not provided on the lower surface of the fixing member 4, a crack was generated on the lower surface of the semiconductor substrate in the example.

Although the present invention has been described above with reference to the plurality of embodiments and the example, it should be understood that the present invention is not limited to the contents of the above embodiments and example. Further, the features described in the embodiments may be freely combined. Further, various improvements, design changes and deletions may be added to the embodiments.

DESCRIPTION OF REFERENCE SYMBOLS

1 SEMICONDUCTOR SUBSTRATE
1a UPPER SURFACE
1b LOWER SURFACE
2 FIRST SEMICONDUCTOR LAYER
3 SECOND SEMICONDUCTOR LAYER
4 FIXING MEMBER
11 LASER LIGHT SOURCE
12 REFLECTION MIRROR
13 CYLINDRICAL LENS
14 OBJECTIVE LENS
20 DIVISION SURFACE
21 FIRST CONVERGENCE POINT
22 SECOND CONVERGENCE POINT
31, 32 CRACK
41a, 41b, 42a, 42b CRACK OPENING FORCE
50 PUSH-UP FORCE
100 LASER LIGHT
101 OPTICAL AXIS

The invention claimed is:
1. A method for manufacturing a semiconductor device comprising the steps of:
preparing a semiconductor substrate including a first semiconductor layer and a second semiconductor layer; and irradiating the semiconductor substrate with laser light from the first semiconductor layer side to divide the semiconductor substrate into individual semiconductor chips, wherein the first semiconductor layer comprises a semiconductor material transparent to the laser light, the second semiconductor layer comprises a semiconductor material opaque to the laser light, and in the step of irradiating with the laser light, laser light having intensity that makes the semiconductor material of the first semiconductor layer opaque to the laser light by multiphoton absorption is irradiated, so that the first semiconductor layer is vaporized, while the laser light is irradiated to the second semiconductor layer, so that the second semiconductor layer is vaporized, wherein the first semiconductor layer of the semiconductor substrate is transparent to the laser light and is fixed to a fixing member for holding the semiconductor substrate, wherein in the step of irradiating with the laser light, the laser light is converged on a boundary surface between the first semiconductor layer and the fixing member, inside the first semiconductor layer, or inside the fixing member.

2. The method for manufacturing the semiconductor device according to claim 1, wherein in the step of irradiating with the laser light, an elliptical beam is irradiated.

3. The method for manufacturing the semiconductor device according to claim 1, wherein in the step of preparing the semiconductor substrate, semiconductor elements are formed in the second semiconductor layer.

4. The method for manufacturing the semiconductor device according to claim 1, wherein a plate member which is transparent to the laser light and has higher rigidity than the fixing member is provided on a surface of the fixing member opposite to a surface to which the semiconductor substrate is fixed.

5. The method for manufacturing the semiconductor device according to claim 1, further comprising a step of forming a crack on the surface of the semiconductor substrate before the step of irradiating with the laser light.

6. The method for manufacturing the semiconductor device according to claim 1, wherein a reflective layer is provided on a surface of the second semiconductor layer of the semiconductor substrate opposite to the first semiconductor layer.

7. The method for manufacturing the semiconductor device according to claim 1, wherein in the step of irradiating with the laser light, the laser light is irradiated so that the semiconductor material of the first semiconductor layer is vaporized.

8. A method for manufacturing a semiconductor device comprising the steps of:

preparing a semiconductor substrate including a first semiconductor layer and a second semiconductor layer; and irradiating the semiconductor substrate with laser light from the first semiconductor layer side to divide the semiconductor substrate into individual semiconductor chips, wherein the first semiconductor layer comprises a semiconductor material transparent to the laser light, the second semiconductor layer comprises a semiconductor material opaque to the laser light, and in the step of irradiating with the laser light, laser light having intensity that makes the semiconductor material of the first semiconductor layer opaque to the laser light by multiphoton absorption is irradiated, so that the first semiconductor layer is vaporized, while the laser light is irradiated to the second semiconductor layer, so that the second semiconductor layer is vaporized, wherein the first semiconductor layer of the semiconductor substrate is transparent to the laser light and is fixed to a fixing member for holding the semiconductor substrate, wherein in the step of irradiating with the laser light, the laser light is converged on a boundary surface between the first semiconductor layer and the fixing member, inside the first semiconductor layer, or inside the fixing member, wherein a plate member which is transparent to the laser light and has higher rigidity than the fixing member is provided on a surface of the fixing member opposite to a surface to which the semiconductor substrate is fixed.

9. A method for manufacturing a semiconductor device comprising the steps of:

preparing a semiconductor substrate including a first semiconductor layer and a second semiconductor layer; and irradiating the semiconductor substrate with laser light from the first semiconductor layer side to divide the semiconductor substrate into individual semiconductor chips, wherein the first semiconductor layer comprises a semiconductor material transparent to the laser light, the second semiconductor layer comprises a semiconductor material opaque to the laser light, and in the step of irradiating with the laser light, laser light having intensity that makes the semiconductor material of the first semiconductor layer opaque to the laser light by multiphoton absorption is irradiated, so that the first semiconductor layer is vaporized, while the laser light is irradiated to the second semiconductor layer, so that the second semiconductor layer is vaporized, and a step of forming a crack on the surface of the semiconductor substrate before the step of irradiating with the laser light.

* * * * *